(12) United States Patent
Sottke et al.

(10) Patent No.: US 7,431,998 B2
(45) Date of Patent: Oct. 7, 2008

(54) TOOL AND METHOD FOR THE CHEMICAL VAPOR DEPOSITION OF A TWO-PHASE LAYER ON A SUBSTRATE MEMBER

(75) Inventors: Volkmar Sottke, Mülheim/Ruhr (DE); Hartmut Westphal, Dermbach/Rhön (DE); Hendrikus Van Den Berg, BT Venlo-Blerick (NL)

(73) Assignee: Kennametal Widia Produktions GmbH & Co. KG, Essen (DE)

( * ) Notice: Subject to any disclaimer, the term of this patent is extended or adjusted under 35 U.S.C. 154(b) by 199 days.

(21) Appl. No.: 10/554,666

(22) PCT Filed: Apr. 23, 2004

(86) PCT No.: PCT/DE2004/000845
§ 371 (c)(1),
(2), (4) Date: Oct. 26, 2005

(87) PCT Pub. No.: WO2004/099463

PCT Pub. Date: Nov. 18, 2004

(65) Prior Publication Data
US 2006/0257689 A1    Nov. 16, 2006

(30) Foreign Application Priority Data
May 7, 2003 (DE) ................. 103 20 652
Mar. 2, 2004 (DE) ................. 10 2004 010 594

(51) Int. Cl.
*B32B 9/00* (2006.01)
*C23C 16/30* (2006.01)

(52) U.S. Cl. .............. 428/698; 51/307; 51/309; 427/255.19; 427/255.21; 427/255.23; 427/255.28; 427/255.391; 428/472; 428/699; 428/701; 428/702

(58) Field of Classification Search ........... 51/307, 51/309; 428/698, 699, 701, 702, 472; 427/255.19, 427/255.21, 255.23, 255.28, 255.391
See application file for complete search history.

(56) References Cited

U.S. PATENT DOCUMENTS 4,714,660 A    12/1987    Gates, Jr.

(Continued)

FOREIGN PATENT DOCUMENTS

EP    149449    * 12/1984

(Continued)

*Primary Examiner*—Archene Turner
(74) *Attorney, Agent, or Firm*—Jonathan Myers; Andrew Wilford

(57) ABSTRACT

The invention relates to a tool, especially a cutting tool, comprising a substrate member onto which at least one layer is deposited by means of CVD, and a method for the chemical vapor deposition of a two-phase layer on a sintered part. According to the invention, the single deposited layer or at least one of the layers is provided with a TiCN phase, TiOCN phase, TiOC phase, or TiC phase and an additional phase consisting of $ZrO_2$ and/or $HfO_2$. $CH_3CN$, $C_5H_5N$, or $C_6H_6$ is used in the gas atmosphere for producing such a layer in addition to $TiCl_4$, $HfCl_4$, and/or $ZrCl_4$ and $CO_2$, the remainder being composed of $H_2$ and/or Ar.

14 Claims, 3 Drawing Sheets

U.S. PATENT DOCUMENTS

| | | | |
|---|---|---|---|
| 5,871,850 A * | 2/1999 | Moriguchi et al. | 428/699 |
| 6,235,416 B1 * | 5/2001 | Konig et al. | 428/701 |
| 6,284,356 B1 * | 9/2001 | Kiriyama | 428/702 |
| 6,426,137 B1 | 7/2002 | Oshika et al. | |
| 6,660,371 B1 * | 12/2003 | Westphal et al. | 428/216 |

FOREIGN PATENT DOCUMENTS

| | | | |
|---|---|---|---|
| EP | 302984 | * | 8/1987 |
| JP | 2002224903 | | 8/2002 |
| JP | 2003001502 | | 1/2003 |
| WO | WO 00/17416 | | 3/2000 |

* cited by examiner

TOOL AND METHOD FOR THE CHEMICAL VAPOR DEPOSITION OF A TWO-PHASE LAYER ON A SUBSTRATE MEMBER

CROSS REFERENCE TO RELATED APPLICATIONS

This application is the US national phase of PCT application PCT/DE2004/000845 filed 23 Apr. 2004 with a claim to the priority of German patent application 10320652.3 itself filed 7 May 2003 and German patent application 102004010594.4 itself filed 2 Mar. 2004.

FIELD OF THE INVENTION

The invention relates to a tool, especially a cutting tool, comprised of a substrate body upon which a layer is deposited by CVD. The invention also relates to a method of CVD deposition of a two phase-layer on a substrate body.

BACKGROUND OF THE INVENTION

Coated substrate bodies for use as cutting elements are basically known.

Thus, for example in German Patent Document 100 17 909 A1, substrate bodies on a tungsten carbide basis and provided with a hard coating are known which have a titanium composite layer with at least one coating of TiC, TiN, TiCN, TiCO and TiCNO and an $Al_2O_3$ and/or $Al_2O_3$—$ZrO_2$ composite layer. In the last mentioned case, $ZrO_2$ particles are dispersed in an $Al_2O_3$ phase.

Furthermore, it is also known to provide layer sequences in the form of TiN—TiCN—TiN layers, optionally with an additional outer $Al_2O_3$ layer. $Al_2O_3$ layers which are deposited by means of a CVD process can, depending upon the process conditions, be in the form of $\alpha$-$Al_2O_3$, $\kappa$-$N_2O_3$ or amorphous $Al_2O_3$. The German Patent Document DE 100 17 909 A1 discloses for the production of a TiCN layer, a CVD process in which at an average temperature range between 700° C. and 950° C., a reaction gas mixture is used which contains $CH_3CN$.

OBJECT OF THE INVENTION

It is the object of the present invention to provide an improved tool and especially a cutting tool of the afore-described type that because of its coating has an improved life in dry machining as well as wet machining and especially in the turning of cast workpieces or heat treatable steels (CK45).

SUMMARY OF THE INVENTION

This object is achieved with the tool according to claim 1 which is characterized in accordance with the invention that the single deposited layer or at least one of the first layers, apart from a TiCN phase or a TiOCN phase or a TiC phase or a TiOC phase has a further comprised of $ZrO_2$ and $HfO_2$. This multiphase layer can be the single layer, an intermediate layer (a layer between two other layers) or an outer layer or coating, whereby, depending upon the use, the procedures can be varied based upon the consideration that with increasing $ZrO_2$ and/or $HfO_2$ proportions, the hardness of the respective layer drops.

Further features of the tool are described in the dependent claims.

Thus the mentioned further phase of $ZrO_2$ and $HfO_2$ can be present in a monoclinic and/or tetragonal form.

Upon the layer defined herein above, according to a further feature, an $Al_2O_3$ layer can also be deposited, preferably as an outer layer or coating and preferably also as an $\alpha$-$Al_2O_3$ layer. The substrate body can be comprised of a hard metal, a is cermet or a ceramic.

Preferably the ratio of the TiCN— phase, the TiOCN phase, TiC phase or TiOC phase to the further phase of $ZrO_2$ and/or $HfO_2$, should lie between 4:1 and 1:4 preferably between 2:1 and 1:1.

As has already been indicated, for example the first phase of TiCN or TiOCN also can be replaced by TiC or TiOC so that the ratio of C:N of 0.5:0.5 can be replaced by 1.0:0.

The present invention encompasses also such tools in which in the TiCN-phase or TiOCN phase or TiOC phase or TiC phase, the titanium is replaced to a small proportion by Hf in the compound $TiC_xN_yO_z$ with $0 \leq x, y, z \leq 1$ so that less than half the titanium can be replaced by Zr or Hf. Preferably a maximum of 20%, and even more preferably a maximum of 10% of the titanium is so replaced. Such compounds can be produced for example when the gas atmosphere from which the respective phase is deposited, contains a substoichiometric amount of oxygen.

According to a further feature or variant of the invention, the two-phase layer can be provided as an intermediate layer which is disposed between TiCN and $Al_2O_3$ and on which a ZrCN coating is externally deposited.

To produce the tool according to the invention it is proposed that upon the sintered substrate body for the CVD deposition of the aforementioned multiphase layer, a method can be used and which is characterized in that, in the gas atmosphere, apart from $TiCl_4$, $HfCl_4$ and/or $ZrCl_4$ and $CO_2$, additionally $CH_3CN$ (acetonitrile) or $C_5H_5N$ (pyridine) or $C_6H_6$ (benzene) is provided, the balance being $H_2$ and/or Ar. When acetonitrile is used the following simultaneous reactions run in the gas phase:

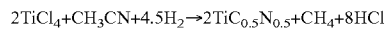

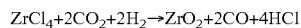

or

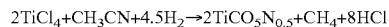

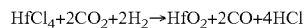

Corresponding reactions occur when instead of acetone, pyridine is used, whereby as a reaction product a $TiC_xN_y$-phase will also arise. However, in the case of use of pyridine in the gas phase the C:N proportion changes from 0.5:0.5 to 0.7:0.3 and when benzene is used the proportion becomes 1.0:0, that is in the first phase less or no nitrogen is contained.

Preferably the following gas proportions are used: $TiCl_4$: 1:4 vol. %, preferably 1:2 vol. %

$ZrCl_4$ and/or $HfCl_4$:0.3 to 4 Vol. % preferably 0.5 to 2 vol. % $C_5H_5N$ or $CH_3CN$ or $C_6H_6$: 0.2 to 2 vol. % preferably 0.5 to 1 vol %.

$CO_2$:0.1 to 3 Vol. %, preferably 0.3 to 2 Vol. %.

Balance Ar and/or $H_2$.

The deposition temperature in a preferred application of the invention lies between 800° and 1000° C. and the gas atmosphere pressure is $5 \times 10^3$ Pa to $6 \times 10^4$ Pa.

In a concrete example, a hard metal substrate body has a hard material phase of WC and a binder phase of 6% by weight Co upon which a layer sequence of TiN—TiCN/$HfO_2$—TiN is deposited and for the deposition of the intermediate layer, the following gas phase composition is chosen:

1.4 vol. % TicCl$_4$, 1.4 vol. % HfCl$_4$, 0.8 vol. % CH$_3$CN, 0.5 Vol. % CO$_2$, balance H$_2$.

The other TiN layers are respectively produced using a convention CVD coating process.

In a corresponding way on a hard metal substrate body, layer sequences of TiN—TiCN—TiCN/HfO$_2$-αAl$_2$O$_3$ can be deposited. It has been found surprisingly that using the multiphase intermediate layer TiCN/HfO$_2$ in accordance with the invention with a CVD process, stable α-Al$_2$O$_3$ can be generated.

BRIEF DESCRIPTION OF THE DRAWINGS

The advantages of the invention which are described in greater detail hereinafter will be apparent from the drawings.

As previously described, on a hard metal substrate body which has the form of a cutting insert of the type SNUN 120408, in the first case, a layer sequence according to the invention of TiN/TiCN/HfO$_2$—TiN is applied. The intermediate layer thus is comprised of two phases namely, TiCN on the one hand and HfO$_2$ on the other.

By comparison therewith, a substrate body of the same composition and the same type is provided with a three layer coating of TiN—TiCN—TiN. In a dry turning of a steel of the type CK45N with the parameters v$_c$=200 m/min, aρ=2.0 mm and f=0.4 mm/revolution, the life of the coating according to the invention was about 15 min whereas the life of the comparative body in accordance with the state of the art was less than 12 min.

Also by comparison with a cutting body in accordance with the coating techniques of the state of the art, with a layer sequence of TiN—TiCN—K —Al$_2$O$_3$, the coating sequence according to the invention of TiN—TiCN—TiCN/HfO$_2$-α-Al$_2$O$_3$ can provide a continuous cut in turn of the workpiece using a coolant/lubricant, that is a wet cut, and with a significant improvement in the life of the tool.

While with the layer sequence in accordance with the state of the art in which the intermediate TiCN layer is deposited with a deposition temperature between 800° C. and 1000° C. and the gas phase only deposits K Al$_2$O$_3$, the tool has a useful life of only six minutes, whereas the life with the layer sequence in which between the TiCN layer and the Al$_2$O$_3$ layer a two phase intermediate layer of TriCN and HfO$_2$ has been interposed, the life is substantially greater. This intermediate layer allows, at the same process conditions, the deposition of α-Al$_2$O$_3$. The life of the tool is 9 minutes which is a 50% improvement. In the composition tests the workpiece was a cast body of GG25 and the cutting insert was of the type CNMG120412-5 and the following turning parameters were used: v$_c$=450 m/min, aρ=2.5 mm and f=0.315 mm/revolution.

Figure 1:
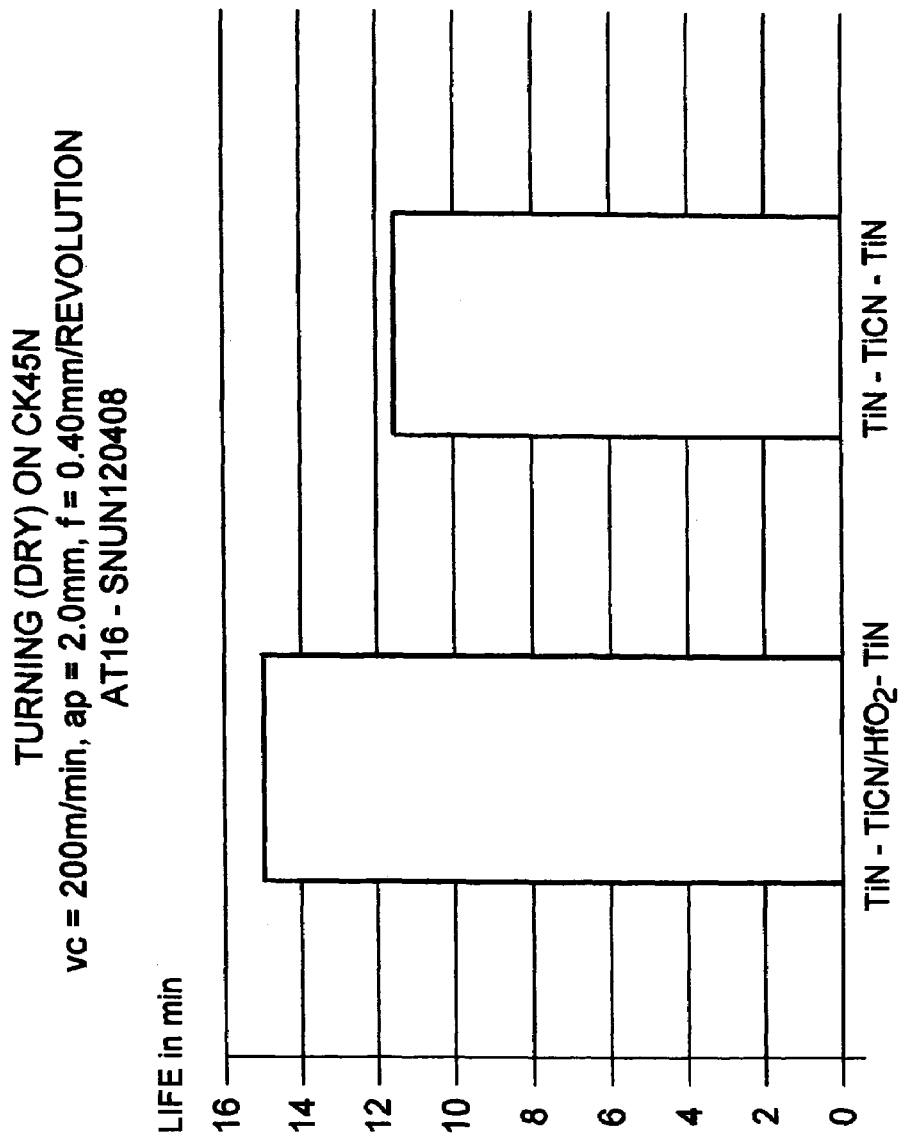
FIGS. 1 to 3 are each a set of comparative bar graphs comparing the life of a cutting tool with a two phase coating or layer according to the invention with the life of a cutting tool with a three phase coating or layer according to the prior art.
Figure 2:
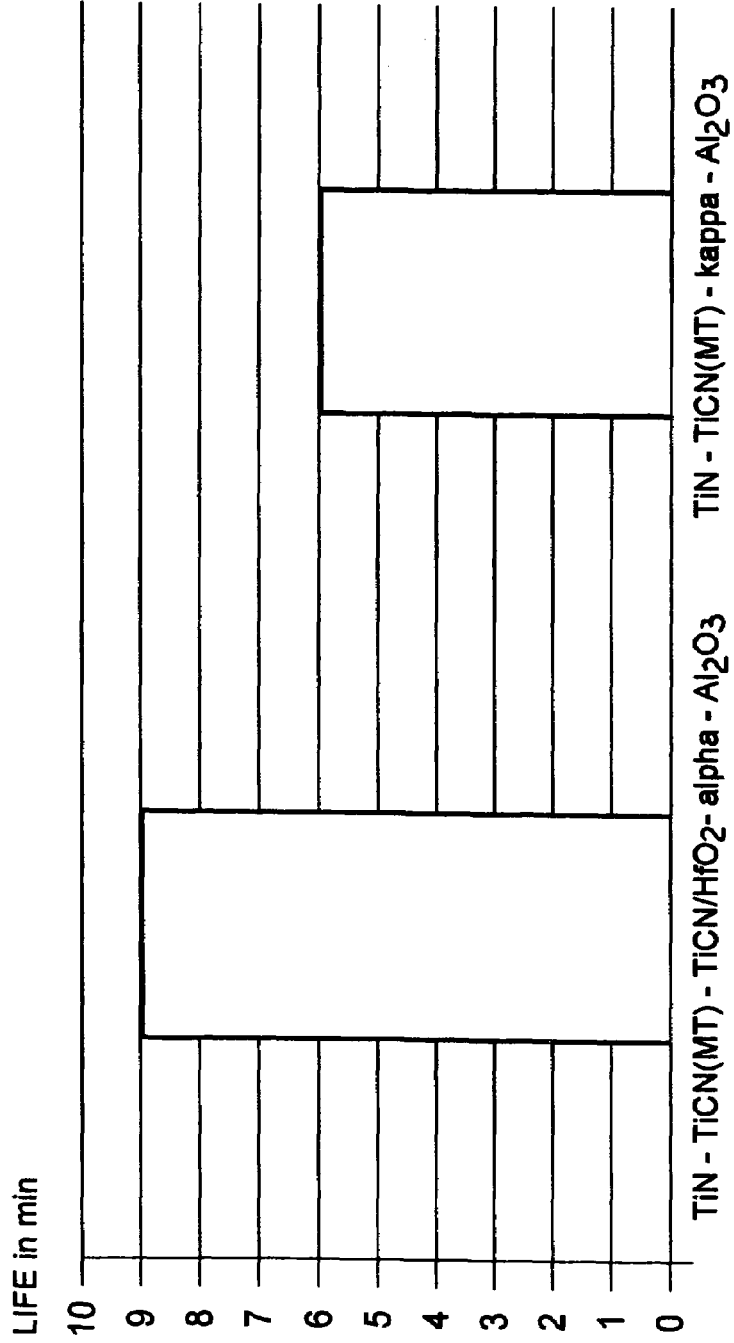
Figure 3:
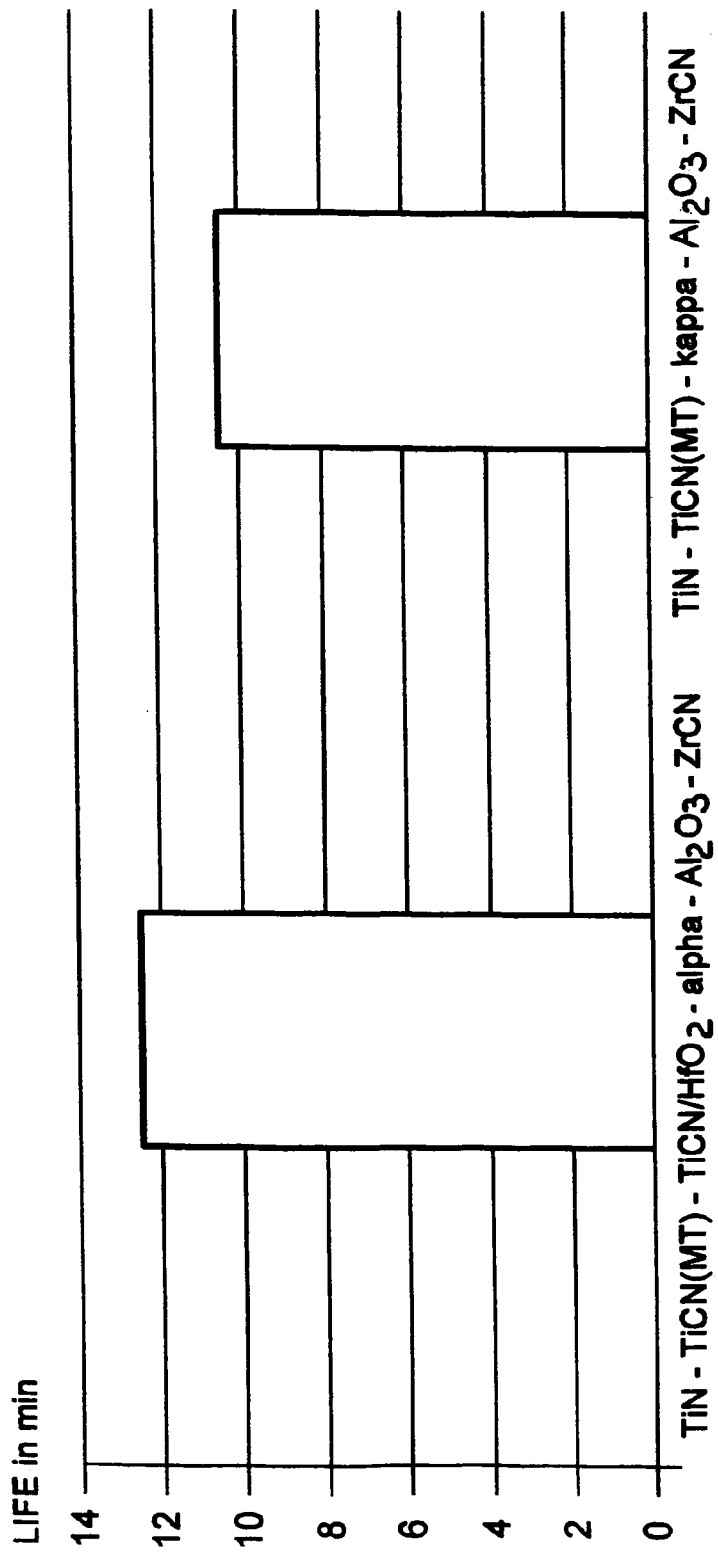

As can be seen from FIG. 3, the coating according to the invention also provides in wet turning with a continuous cut a significant improvement in the life of the tool. On a substrate body of the same composition as type CNMG120412-5, a layer sequence of the composition TiN—TiCN(MT)—TiCN/HfO$_2$-α-Al$_2$O$_3$ was applied in a first case and in the second case a layer sequence of TiN—TiCN(MT)K—Al$_2$O$_3$—ZrCN was applied.

Both cutting inserts were used for the turning of a cast iron body of the type GG25 with the following machining parameters v$_c$=400 m/min, aρ=2.5 mm, f=0.315 mm/revolution.

The life of the insert which was made with the layer composition according to the invention in which a two-phase intermediate layer TiCN/HfO$_2$ was introduced, was 12.5 min whereas the cutting insert according to the state of the art had a life of 10.2 min.

The aforedescribed test results show clearly that both is with dry turning and also with turning in a wet state, significant improvements in the life of the tool can be achieved.

The invention claimed is:

1. A tool, especially a cutting tool comprised of a substrate body upon which a single coating or at least one layer is deposited by means of CVD, wherein said single coating or at least one deposited layer consists of two phases, wherein the single deposited coating or at least one of the layers has apart from a first TiCN phase or a TiOCN phase or a TiOC phase or a TiC phase, a further phase consisting of ZrO$_2$ or HfO$_2$.

2. The tool according to claim 1 wherein the further phase is present in monoclinic and/or tetragonal form.

3. The tool according to claim 1 wherein on the coating or layer which consists of a first TiCN phase or a TiOCN phase or a TiOC phase or a TiC phase and a ZrO$_2$ or HfO$_2$ as a further phase, Al$_2$O$_3$ is deposited.

4. The tool according to claim 3 wherein the Al$_2$O$_3$ is deposited as an outer coating.

5. The tool according to claim 4 wherein the Al$_2$O$_3$ deposited as an outer coating is deposited as α-Al$_2$O$_3$.

6. The tool according to claim 1, wherein the substrate body is comprised of a hard metal, a cermet or a ceramic.

7. The tool according to claim 1, wherein the ratio of the TiCN phase, TiOCN phase, TiC phase or TiOC phase to the further phase lies between 4:1 and 1:4.

8. The tool according to claim 7, wherein the ratio of the TiCN phase, TiOCN phase, TiC phase or TiOC phase to the further phase lies between 2:1 and 1:2.

9. The tool according to claim 1, wherein in the TiCN phase, or TiOCN phase, or TiOC phase or TiC phase, the titanium is replaced to a small proportion by Zr or Hf.

10. The tool according to claim 1, wherein the layer consisting of two phases is an intermediate layer between two TiN layers.

11. A method of CVD deposition of a layer consisting of two phases upon a substrate body according to claim 1, comprising the step of introducing during said CVD deposition, into a gas atmosphere apart from TiCl$_4$, HfCl$_4$ or ZrCl$_4$ and CO$_2$, acetonitrile or pyridine or benzene, the balance being H$_2$ and/or Ar.

12. The method of CVD deposition according to claim 11 wherein the gas atmosphere has the following gas proportions:

TiCl$_4$: 1 to 4 vol. %, ZrCl$_4$ or HfCl$_4$ 0.3 to 4 vol. %, pyridine or acetonitrile or benzene: 0.2 to 2 vol. %; CO$_2$: 0.1 to 3 vol. %, balance Ar and/or H$_2$.

13. The method of CVD deposition according to claim 12 wherein the gas atmosphere has the following gas proportions: TiCl$_4$: 1 to 2 vol. %, ZrCl$_4$ or HfCl$_4$: 0.5 to 2 vol. %, pyridine or acetonitrile or benzene: 0.5 to 1 vol. %; CO$_2$: 0.3 to 2 vol. %.

14. The method of CVD deposition according to claim 12 carried out at a deposition temperature between 800° C. and 1000° C. and at a gas atmosphere pressure between 5×10$^3$ and 6×10$^4$ Pa.

* * * * *